United States Patent
Cheng et al.

(10) Patent No.: US 9,576,817 B1
(45) Date of Patent: Feb. 21, 2017

(54) PATTERN DECOMPOSITION FOR DIRECTED SELF ASSEMBLY PATTERNS TEMPLATED BY SIDEWALL IMAGE TRANSFER

(71) Applicant: International Business Machines Corporation, Armonk, NY (US)

(72) Inventors: Joy Cheng, San Jose, CA (US); Michael A. Guillorn, Cold Springs, NY (US); Chi-Chun Liu, Altamont, NY (US); Hsinyu Tsai, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/957,835

(22) Filed: Dec. 3, 2015

(51) Int. Cl.
H01L 21/311 (2006.01)
H01L 21/027 (2006.01)

(52) U.S. Cl.
CPC ..... *H01L 21/31133* (2013.01); *H01L 21/0273* (2013.01); *H01L 21/31144* (2013.01)

(58) Field of Classification Search
CPC ...... C08L 53/00; C08L 53/005; G03F 7/0002; G03F 1/00; H01L 21/0337; H01L 21/3086; H01L 21/3081; H01L 21/0271; H01L 21/31144; H01L 21/0274; H01L 21/308; H01L 21/76816; B81C 2201/0198
See application file for complete search history.

(56) References Cited

U.S. PATENT DOCUMENTS

| | | | |
|---|---|---|---|
| 7,811,940 B2 | 10/2010 | Sandhu | |
| 7,923,373 B2 | 4/2011 | Sandhu | |
| 8,771,929 B2 | 7/2014 | Guillorn et al. | |
| 8,853,085 B1 * | 10/2014 | Abdallah | H01L 21/3081 257/E21.035 |
| 8,906,802 B2 | 12/2014 | Wahl et al. | |
| 2007/0224823 A1 * | 9/2007 | Sandhu | H01L 21/0332 438/694 |
| 2008/0122125 A1 * | 5/2008 | Zhou | H01L 21/3088 257/797 |
| 2008/0193658 A1 * | 8/2008 | Millward | B81C 1/00031 427/401 |
| 2008/0299774 A1 * | 12/2008 | Sandhu | H01L 21/0337 438/696 |
| 2011/0033786 A1 | 2/2011 | Sandhu | |

(Continued)

FOREIGN PATENT DOCUMENTS

KR   10-1428820 B1   8/2014

OTHER PUBLICATIONS

Yaegshi, H. et al., "Important Challenge for Optical Lithography Extension utilizing Double Patterning Process", Journal of Photopolymer Science and Technolog, 2011, vol. 24, No. 5, pp. 491-495.

*Primary Examiner* — Bac Au
(74) *Attorney, Agent, or Firm* — Scully, Scott, Murphy & Presser, P.C.; Louis J. Percello, Esq.

(57) ABSTRACT

After forming spacers over a hard mask layer using a sidewall image transfer process, a neutral material layer is formed on the portions of the hard mask layer that are not covered by the spacers. The spacers and the neutral material layer guide the self-assembly of a block copolymer material. The microphase separation of the block copolymer material provides a lamella structure of alternating domains of the block copolymer material.

17 Claims, 8 Drawing Sheets

(56) References Cited

U.S. PATENT DOCUMENTS

| | | | |
|---|---|---|---|
| 2013/0183827 A1* | 7/2013 | Millward | H01L 21/0273 438/694 |
| 2013/0309457 A1* | 11/2013 | Rathsack | G03F 7/0002 428/195.1 |
| 2014/0264896 A1* | 9/2014 | Lu | H01L 23/5329 257/773 |
| 2014/0273476 A1 | 9/2014 | Cheng et al. | |
| 2014/0353800 A1 | 12/2014 | Guillorn et al. | |
| 2015/0024597 A1 | 1/2015 | Gao et al. | |
| 2015/0031207 A1* | 1/2015 | Bencher | H01L 21/0337 438/696 |
| 2015/0111386 A1 | 4/2015 | Rathsack et al. | |
| 2015/0111387 A1 | 4/2015 | Somervell et al. | |
| 2015/0225850 A1* | 8/2015 | Arora | C23C 16/45525 216/51 |

\* cited by examiner

PATTERN DECOMPOSITION FOR DIRECTED SELF ASSEMBLY PATTERNS TEMPLATED BY SIDEWALL IMAGE TRANSFER

BACKGROUND

The present application relates to semiconductor processing, and more particularly to directed self-assembly (DSA) of block copolymer materials templated by spacers formed by a sidewall image transfer process.

Directed self-assembly (DSA) of block copolymers through physically templating is an emerging patterning technology for generating narrow lines in integrated circuits with smaller pitches beyond the current optical lithographic limit. During the DSA process, block copolymers composed of chemically distinct polymer chains (blocks) that are covalently bonded at their ends self-assemble to form nanoscale structures, often with dimensions in the range of 5 nm to 50 nm, due to microphase separation of immiscible blocks. The DSA pattern generated from the block copolymers can be used as a mask for further pattern transfer into functional materials such as insulating, semiconducting, and conducting materials.

The pitch of the features generated from the DSA pattern is limited by lithography techniques used to print the templates employed to guide the alignment of the block copolymers. The continued scaling of design features in ICs requires the pitch of the templates to be scaled below 80 nm which is below a minimum lithographic pitch can be printed with present lithographic tools. Accordingly, a need exists for improved methods that allow forming nanoscale structures by self-assemble of block copolymers guided by templates having pitches beyond the current optical lithographic limit.

SUMMARY

The present application provides methods for directed self-assembly of a block copolymer material with templates having pitches beyond the current optical lithographic limit. After forming spacers over a hard mask layer using a sidewall image transfer process, a neutral material layer is formed on the portions of the hard mask layer that are not covered by the spacers. The spacers and the neutral material layer guide the self-assembly of a block copolymer material. The microphase separation of the block copolymer material provides a lamella structure of alternating domains of the block copolymer material.

In one aspect of the present application, a method of directed self-assembly of a block copolymer material is provided.

In one embodiment, the method includes forming spacers on sidewalls of a plurality of mandrels located on a hard mask layer. The plurality of mandrels is then removed, leaving the spacers protruding from a top surface of the hard mask layer. Next, a neutral material layer is formed on exposed portions of the hard mask layer that are not covered by the spacers.

In another embodiment, the method includes forming spacers on sidewalls of a plurality of mandrels located on a template layer that is present over a hard mask layer. The plurality of mandrels is then removed, leaving the spacers protruding from a top surface of the template layer. After removing portions of the template layer that are not cover by the spacers to provide template structures, a neutral material layer is formed on exposed portions of the hard mask layer that are not covered by the template structures.

DETAILED DESCRIPTION

Figure 1:
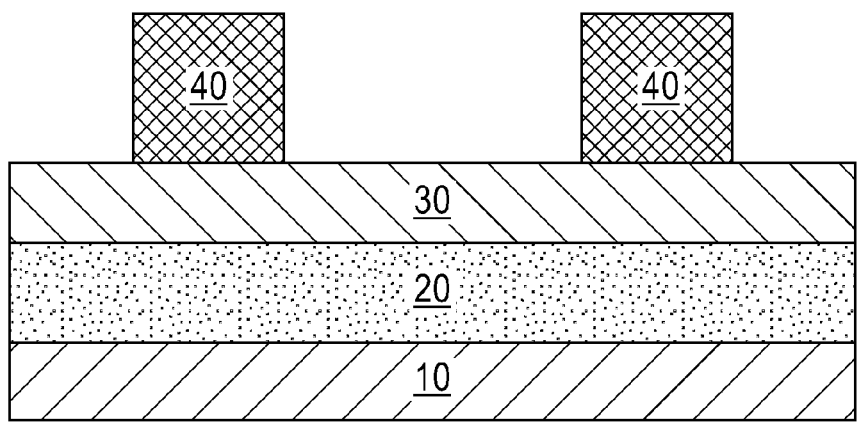
FIG. 1 is a cross-sectional view of a first exemplary semiconductor structure including mandrels located over a hard mask layer according to a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, a first exemplary semiconductor structure according to a first embodiment of the present application includes a plurality of mandrels 40 formed over a material stack. The material stack is formed on a substrate 10 and it includes, from bottom to top, an organic planarization layer (OPL) 20 and a hard mask layer 30.

The substrate 10 can be a semiconductor substrate, a dielectric substrate, a conductive material substrate, or a combination thereof. In one embodiment, the substrate 10 can include a bulk semiconductor substrate or a semiconductor-on-insulator (SOI) substrate as known in the art. The substrate 10 can optionally include a metal interconnect structure including at least one dielectric material layer and metal lines and/or metal via structures embedded therein. The top surface of the substrate 10 can be planar, or can have a non-planar topography.

The OPL 20 includes a self-planarizing organic material that can provide a smooth and planar top surface when applied. In one embodiment, the OPL 20 includes a carbon-rich material. The term "carbon-rich" refers to a material having a composition comprising greater than 50% by weight carbon, preferably greater than 70% by weight carbon, and more preferably from 75% to 80% by weight carbon, based upon the total solids in the carbon-rich composition taken as 100% by weight. Exemplary carbon-rich materials include, but are not limited to, spin-on carbon (SOC) and amorphous carbon. The OPL 20 can be formed by spin coating or chemical vapor deposition (CVD). The thickness of the OPL 20 can be from 10 nm to 300 nm, although lesser and greater thicknesses can also be employed.

The hard mask layer 30 includes a dielectric oxide such as, for example, silicon oxide or a dielectric metal oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In one embodiment, the hard mask layer 30 is a neutral hard mask layer composed of a material that is neutral to a block copolymer material used for DSA. That is, the hard mask layer 30 is comprised of a material that does not show a strong wetting affinity for one of the polymer blocks over the other polymer block in the block copolymer material. In one embodiment, the hard mask layer 30 is comprised of a nitrogen doped silicon carbide or nitrogen doped hydrogenated silicon carbide layer. Nitrogen doped silicon carbide is a compound of silicon, carbon and nitrogen, denoted, e.g., as SiCN. Nitrogen doped hydrogenated silicon carbide is a compound of silicon, carbon, nitrogen and hydrogen, denoted, e.g., as SiC(N,H). An exemplary nitrogen doped silicon carbide or nitrogen doped hydrogenated silicon carbide is NBloK™, Applied Materials, Santa Clara, Calif. The hard mask layer 30 can be formed, for example, by CVD, atomic layer deposition (ALD), plasma-enhanced chemical vapor deposition (PECVD) or spin coating. The thickness of the hard mask layer 30 can be from 10 nm to 300 nm, although lesser and greater thicknesses can also be formed.

The mandrels 40 that are disposed on a top surface of the hard mask layer 30 can include any material that can be removed selective to sidewall spacers subsequently formed along the sidewalls of each mandrel 40. In one embodiment, the mandrels 40 may be composed of amorphous silicon, polysilicon, amorphous or polycrystalline germanium, an amorphous or polycrystalline silicon-germanium alloy material, amorphous carbon, diamond-like carbon or organosilicate glass. In some embodiments, the mandrels 40 may also be composed of a metal, such as, for example, Al, W or Cu.

The mandrels 40 can be formed by first depositing a blanket layer of a mandrel material on the top surface of the hard mask layer 30 (not shown). The mandrel material layer can be formed, for example, by CVD or PECVD. The thickness of the mandrel material layer can be from 50 nm to 300 nm, although lesser and greater thicknesses can also be employed. Following deposition of the mandrel material layer, the mandrel material layer can be patterned by lithography and etching. The patterning of the mandrel material layer can be performed, for example, by applying a photoresist layer (not shown) over the mandrel material layer, lithographically patterning the photoresist layer to define a set of areas covered by the patterned photoresist layer, and transferring the pattern in the photoresist layer into the mandrel material layer by an anisotropic etch. The anisotropic etch can be a dry etch such as, for example, reactive ion etching (RIE) or a wet etch. The remaining portions of the mandrel material layer constitute the mandrels 40.

Each of the mandrels 40 that is formed may have a rectangular shape in cross-section. The width of the mandrels 40 is typically greater than a minimum feature size that may be formed using a specific lithographic technique. In one embodiment, the width of each of the mandrels 40 is from 80 nm to 180 nm, although lesser and greater widths can also be employed. The spacing between adjacent mandrels 40 can be from 50 nm to 200 nm, although lesser and greater spacings can also be employed.

Figure 2:
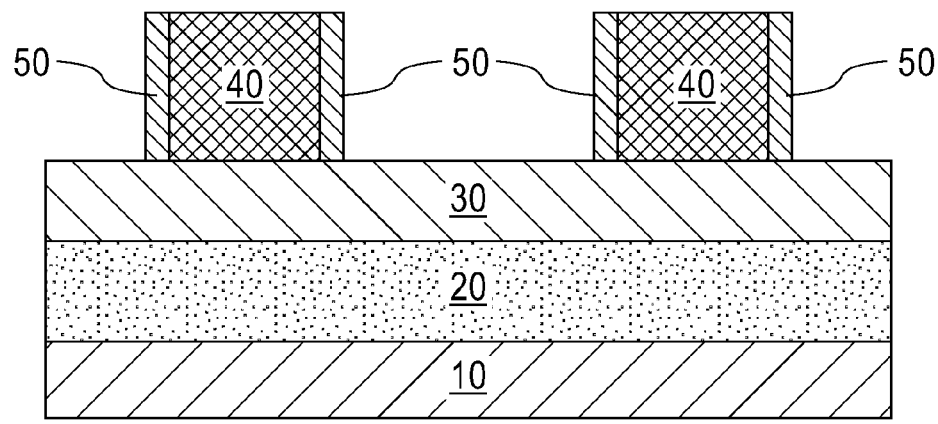
FIG. 2 is a cross-sectional view of the first exemplary semiconductor structure of FIG. 1 after forming spacers along sidewalls of the mandrels.

Referring to FIG. 2, spacers 50 are formed along the sidewalls of the mandrels 40. The spacers 50 may be composed of a dielectric material that has an etch selectivity that differs with respect to the dielectric materials of the hard mask layer 30 and the mandrels 40. In one embodiment of the present application, the spacers 50 may include a dielectric nitride such as silicon nitride.

The spacers 50 can be formed by depositing a spacer material layer (not shown) over exposed surfaces of the mandrels 40 and the hard mask layer 30 by a conformal deposition process, such as, for example, CVD, PECVD or ALD. The spacer material layer that is formed may have a thickness from 5 nm to 15 nm, although lesser and greater thicknesses can also be employed. Following the conformal deposition, an anisotropic etch such as, for example, RIE is performed to completely remove the spacer material deposited on the horizontal surfaces of the hard mask layer 30 and the mandrels 40, while the spacer material deposited on vertical sidewalls of the mandrels 40 is retained. The remaining portions of the spacer material layer constitute the spacers 50.

The width of each of the spacers 50, as measured at its base, can be from 5 nm to 10 nm, although lesser and greater widths can also be employed. After removal of the horizontal portions of the spacer material layer, top surfaces of the mandrels 40 are exposed Referring to FIG. 3, a mandrel pull process is performed to remove the mandrels 40 from the structure, leaving the spacers 50 standing free on the hard mask layer 30. Any wet or dry etch process capable of etching the material of the mandrels 40 selective to the material of the spacers 50 can be used. For example, the mandrels 40 may be removed utilizing an oxygen-based plasma etching technique. The plasma etching process typically renders the top surface of the hard mask layer 30 and sidewall surfaces of the spacers 50 more hydrophilic.

Figure 4:
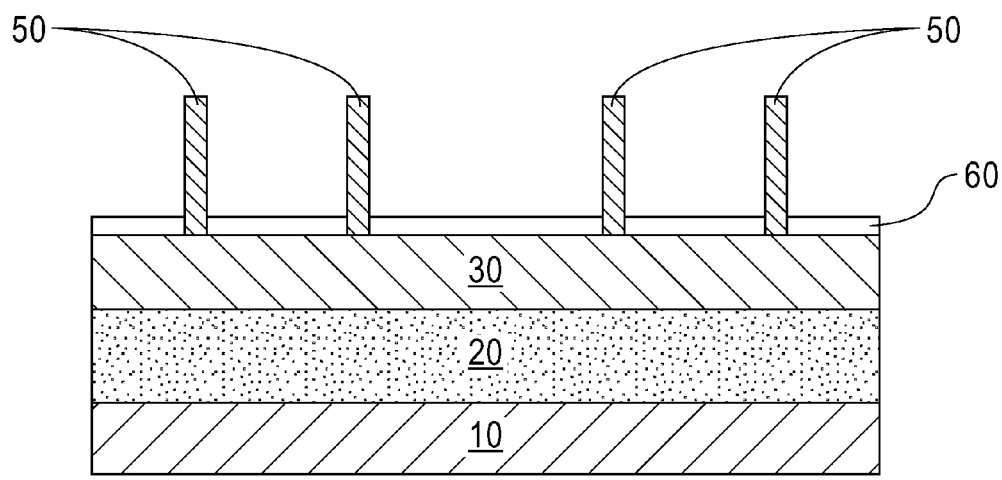
FIG. 4 is a cross-sectional view of the first exemplary semiconductor structure of FIG. 3 after forming a neutral material layer over the exposed portions of the hard mask layer.

Referring to FIG. 4, a neutral material layer 60 is formed on the exposed portions of the hard mask layer 30. The neutral material layer 60 may include a material chemically neutral to the different polymer blocks in a block copolymer material for DSA. That is, the neutral material has substantially the same wetting affinity toward the different polymer blocks in the block copolymer material, thus facilitating the formation of polymer domains that are oriented perpendicularly to the top surface of the neutral material layer 60.

In one embodiment, the neutral material layer 60 may be made from a polymer brush material end substituted with a reactive functional group that is capable of attaching to the top surface of the hard mask layer 30. Exemplary polymer brush materials that can be employed in the present application are random copolymers of the constituent polymer blocks of the block copolymer material used for DSA having reactive end groups such as, for example, hydroxyl groups, amino groups, halo groups, or the like. These reactive end groups may react with hydroxylated groups present on the top surface of the hard mask layer 30. In one embodiment and when the block copolymer for DSA is a diblock copolymer of polystyrene (PS) and polymethyl methacrylate (PMMA), the neutral material layer 60 can include a random copolymer of styrene and methyl methacrylate with a hydroxyl end group (PS-r-PMMA-OH). The hydroxyl group at the end of the polymer chain will be covalently bonded with a hydroxyl group on the top surface of the hard mask layer 30 through a condensation reaction. Because there is only one reactive functional group per polymer chain, this reaction will be self-limiting and only one monolayer of polymer brush material will be anchored to the top surface of the hard mask layer 30. The unreacted polymer brush material is still soluble in solvent. In one embodiment and when the oxygen-based plasma is used to remove mandrels 40, a styrene-rich PS/PMMA polymer brush material may be employed to provide the neutral material layer 60 due to the high surface hydrophilicity of the hard mask layer 30 produced by the oxygen-based plasma etching process.

To form the neutral material layer 60, a polymer brush material is applied onto the exposed surfaces of the hard mask layer 30 and the spacers 50 by spin coating. The polymer brush material is then baked at a proper temperature to activate the reaction between the functional groups on the polymers and on the top surface of the hard mask layer 30. Excess polymer brush material that is not bound to the top surface of the hard mask layer 30 can then be removed with solvents that do not significantly affect the neutrality of the neutral material layer 60. The solvents employed to remove excess polymer brush material may vary, of course, depending on the polymeric material employed. Suitable solvents include, but are not limited to, propylene glycol monomethyl ether acetate (PGMEA), n-butyl acetate (nBA), toluene and anisole.

In another embodiment, in instances where the hard mask layer 30 is a neutral hard mask layer, the neutral material layer 60 may be made from the same material as that used for the neutral hard mask layer, and in one embodiment they are both comprised of a nitrogen-doped silicon carbide, a nitrogen-doped hydrogenated silicon carbide, such as NBlok™, or combinations thereof. The neutrality of the neutral hard mask is thus recovered.

By formation of the neutral material layer 60 to modify the surface chemistry, the top surface of the hard mask layer 30 is thus selectively neutralized from the effects of plasma etching performed to remove the mandrels 40, whereas selectivity of the vertical sidewalls of the spacers 50 for one polymer block over the other is preserved so to facilitate formation of perpendicular oriented lamella pattern. This enables the use of sidewall spacers obtained from the sidewall image transfer process as the templates.

Figure 5:
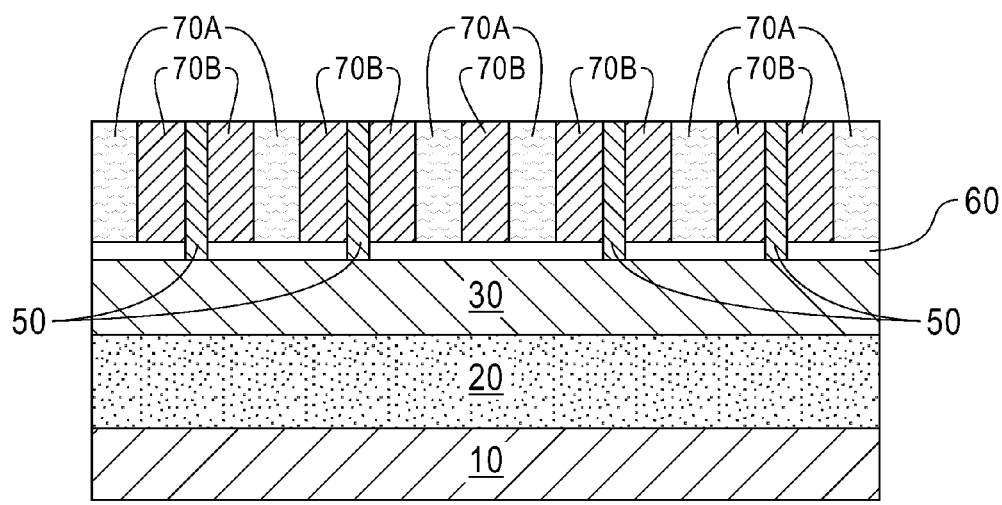
FIG. 5 is a cross-sectional view of the first exemplary semiconductor structure of FIG. 4 after directed self-assembly of a block copolymer material to form alternating first domains and second domains.

Referring to FIG. 5, a block copolymer layer (not shown) is deposited onto the neutral material layer 60 and between spacers 50 and is thereafter annealed, thereby forming a vertically oriented lamellar pattern of alternating first domains 70A and second domains 70B oriented perpendicular to the top surface of the neutral material layer 60. As used herein, the term "lamellar pattern" refers a phase domain pattern having first polymer block and the second polymer block that are arranged alternately and parallel with respect to one another.

The block copolymer layer includes a block copolymer material comprising a first polymer block and a second polymer block that are immiscible with each other. Under suitable conditions, polymer blocks of such polymer self-organize into a nanoscale pattern. By "nanoscale pattern" it is meant that features have a size of less than 50 nm. Exemplary block copolymers that can be employed for forming the nanoscale periodic pattern include, but are not limited to, poly(styrene-block-methyl methacrylate) (PS-b-PMMA), poly(ethylene oxide-block-isoprene) (PEO-b-PI), poly(ethylene oxide-block-butadiene) (PEO-b-PBD), poly (ethylene oxide-block-styrene) (PEO-b-PS), poly(ethylene oxide-block-methylmethacrylate) (PEO-b-PMMA), poly (ethyleneoxide-block-ethylethylene) (PEO-b-PEE), poly (styrene-block-vinylpyridine) (PS-b-PVP), poly(styrene-block-isoprene) (PS-b-PI), poly(styrene-block-butadiene) (PS-b-PBD), poly(styrene-block-ferrocenyldimethylsilane) (PS-b-PFS), poly(butadiene-block-vinylpyridine) (PBD-b-PVP), poly(isoprene-block-methyl methacrylate) (PI-b-PMMA), poly(styrene-block-lactic acid) (PS-b-PLA) and poly(styrene-block-dymethylsiloxane) (PS-b-PDMS). In one embodiment, PS-b-PMMA is used.

To form the nanoscale periodic pattern, the block copolymer material is first dissolved in a suitable solvent to form a block copolymer solution, which is then applied onto the neutral material layer 60 and between spacers 50 to provide the block copolymer layer. The solvent system used for dissolving the block copolymer material and forming the block copolymer solution may comprise any suitable solvent including, but not limited to, toluene, propylene glycol monomethyl ether acetate (PGMEA), propylene glycol monomethyl ether (PGME) and acetone. The block copolymer solution can be applied by any suitable techniques including, but not limited to, spin coating, spraying and dip coating.

The microphase separation of the different polymer blocks contained in the block copolymer layer can be achieved, for example, by annealing the block copolymer layer at an elevated temperature. In one embodiment, the block copolymer layer can be annealed by solvent vapor annealing or by thermal annealing at an elevated temperature to form the first domains 70A including the first polymer block, and the second domains 70B including the second polymer block. The anneal may be performed, for example, at a temperature from about 180° C. to about 300° C. for a duration from 30 seconds to about 10 hours.

The domain sizes usually determined by respective molar mass of individual separated polymer blocks and wetting properties of the spacers. In one embodiment and as shown in FIG. 5, the domain size across the entire width of the spaces between spacers 50 is uniform for each of the domains (70A, 70B). Each of the first domains 70A has a first width. Each of the second domains 70B has a second width. In some embodiments, the second width is the same as the first width. In other embodiments, the second width is different from the first width. Each of the first width and second widths are sub-lithographic, i.e., less than 50 nm.

In the first embodiment of the present application, the spacers 50 that are employed to guide the self-assembly and alignment of a block copolymer material are generated using a sidewall image transfer process, the width of the spacers 50 and the spaces between adjacent spacers 50 can be substantially smaller than the minimum size allowed by a given lithographic technique. The spacers 50 with tighter pitch can thus formed to increase the feature density on a given substrate. In addition, since the width of the spacers 50 is determined through layer formation rather than lithography, the spacer uniformity can be improved, which in turn can improve the pattern uniformity.

Figure 6:
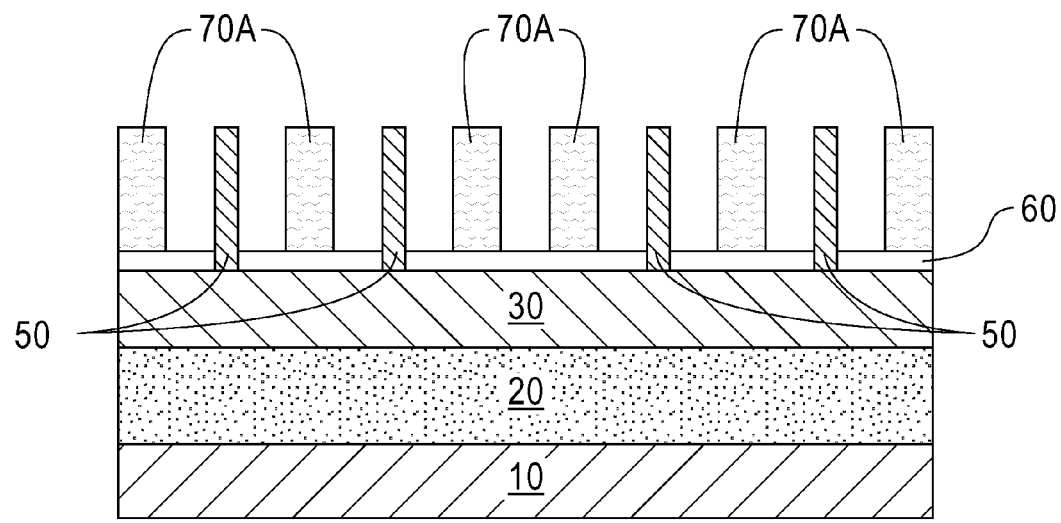
FIG. 6 is a cross-sectional view of the first exemplary semiconductor structure of FIG. 5 after removing the second domains.

Referring to FIG. 6, one type of domain is completely removed selective to the other type of domain. In one embodiment and as shown in FIG. 6, the second domains 70B can be removed selective to first domains 70A. In this case, the second polymer block of the block copolymer material is removed selective to the first polymer block. The removal of the second domains 70B selective to the first domains 70A can be performed, for example, by an anisotropic etch. For example, when the block copolymer material is a diblock copolymer of PS and PMMA (PS-b-PMMA), the PMMA block can be selectively removed by a dry etch using oxygen and/or argon and/or fluorocarbon gas chemistry. A DSA pattern including the first domains 70A is formed over the neutral material layer 60. The first domains 70A constitute a set of protruding structures that protrudes above the top surface of the neutral material layer 60.

Subsequently, the DSA pattern can be transferred through the OPL 20 into the substrate 10 by methods known in the art, thereby forming structures with a sub-lithographic dimension (not shown). The structures can be fin structures or interconnect structures.

Figure 7:
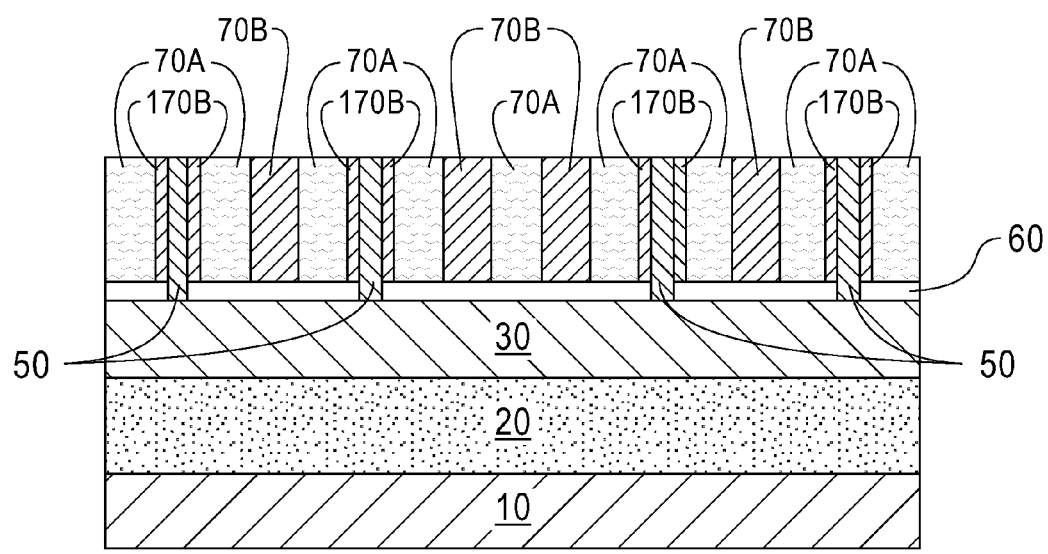
FIG. 7 is a cross-sectional view of a variation of the first exemplary semiconductor structure of FIG. 5 in instances where a half-width domain including the same polymer block as the second domains is formed adjacent to each sidewall of the spacers.

Referring to FIG. 7, a variation of the first exemplary semiconductor structure of FIG. 5 can be obtained in instances where the DSA process results in formation of a half-width domain 170B adjacent to each sidewall of the spacers 50. The half-width domains 170 include the second polymer block and have a domain size half of the domain size of the second domains 70B.

Figure 8:
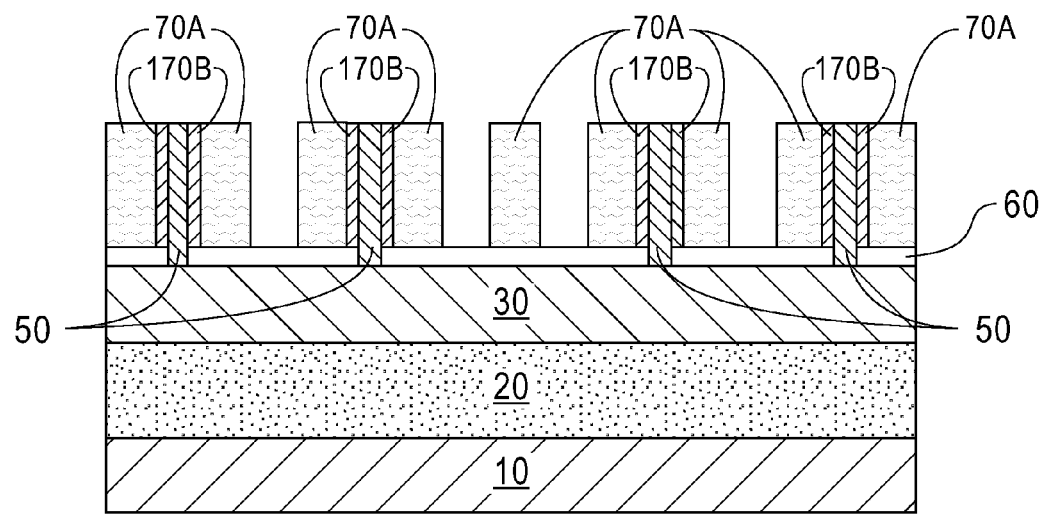
FIG. 8 is a cross-sectional view of the variation of the first exemplary semiconductor structure of FIG. 7 after removing the second domains.
Figure 8A:
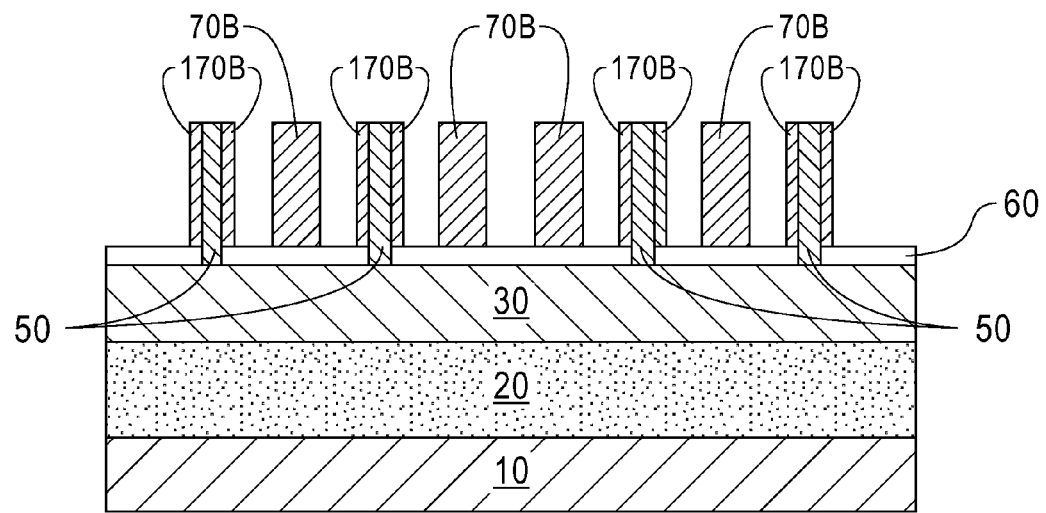
FIG. 8A is a cross-sectional view of the variation of the first exemplary semiconductor structure of FIG. 7 after removing the first domains.

Referring to FIGS. 8 and 8A, the processing steps of FIG. 6 are performed to remove one type of domain selective to the other type of domain. In one embodiment and as shown in FIG. 8, the second domains 70B are removed selective to the first domains 70A. In another embodiment and as shown in FIG. 8A, the first domains 70A are removed selective to the second domains 70B. In both cases, the half-width domains 170B remain on sidewalls of the spacers 50 after the selective removal of either domains 70A or 70B.

Figure 9:
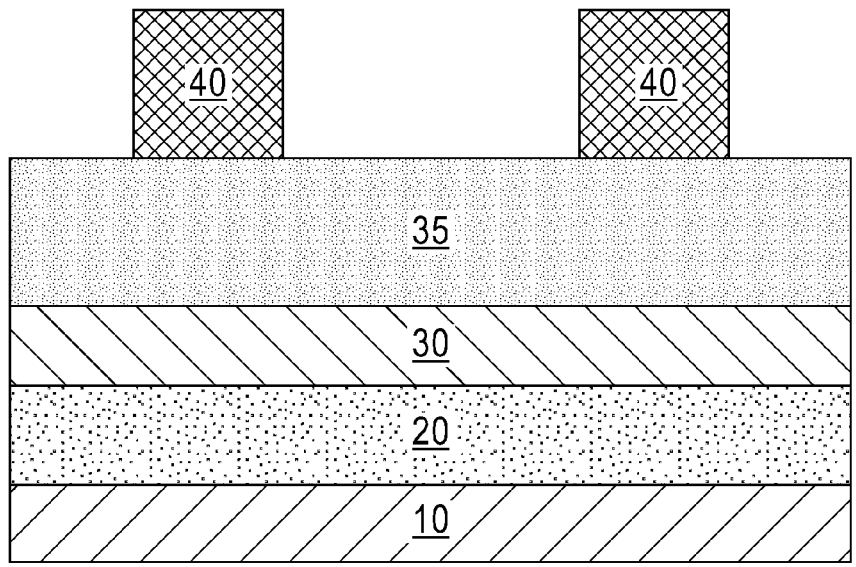
FIG. 9 is a cross-sectional view of a second exemplary semiconductor structure including mandrels located over a template layer that is present over a hard mask layer according to a second embodiment of the present application.

Referring to FIG. 9, a second exemplary semiconductor structure according to a second embodiment of the present application includes a plurality of mandrels 40 formed over a material stack. The material stack is formed on a substrate 10 and it includes, from bottom to top, an organic planarization layer (OPL) 20, a hard mask layer 30 and a template layer 35. Each of the substrate 10, the OPL 20, the hard mask layer 30 and the mandrels 40 can include a material the same as that described above in FIG. 1 and can be formed by performing the processing steps described above in FIG. 1.

The template layer 35 formed on top of the hard mask layer 30 is employed to generate template structures to guide phase separation and alignment of the block copolymer during DSA. The template layer 35 may include a material having a higher wetting affinity to one polymer block than the other polymer block of the block copolymer used for DSA. In one embodiment, the template layer 35 can include hydrogen silsesquioxane (HSQ) or methyl silsesquioxane (MSQ). The template layer 35 can be formed utilizing any conventional deposition process including, but not limited to, CVD, PECVD, evaporation and spin coating. The thickness of the template layer 35 can be from 10 nm to 300 nm, although lesser or greater thicknesses can also be employed.

Figure 10:
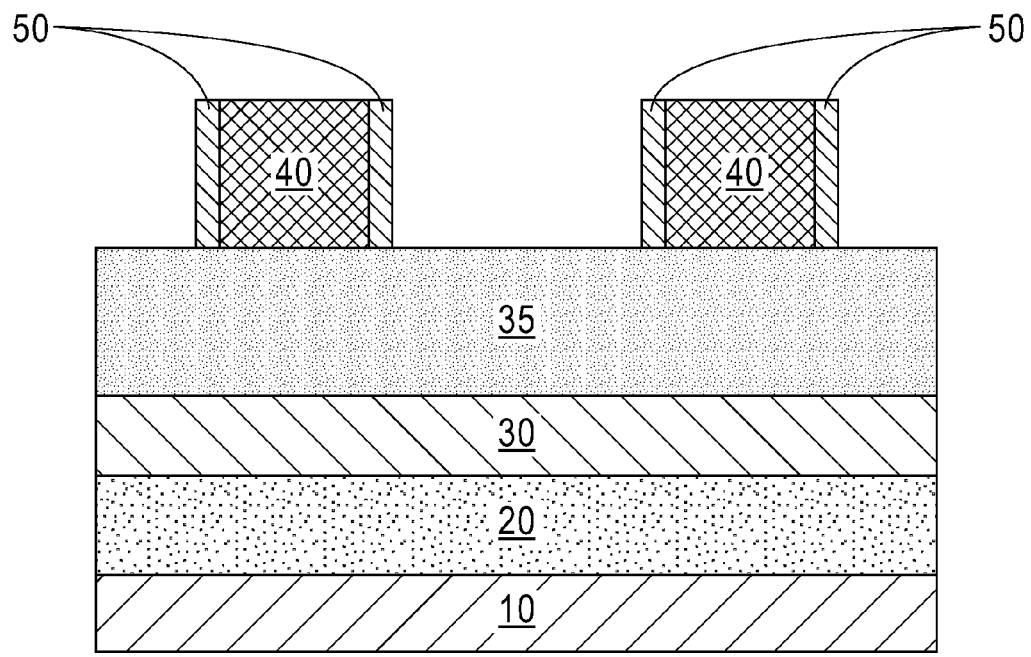
FIG. 10 is a cross-sectional view of the second exemplary semiconductor structure of FIG. 9 after forming spacers along sidewalls of the mandrels.

Referring to FIG. 10, spacers 50 are formed on sidewalls of the mandrels 40 by performing the processing steps of FIG. 2.

Figure 3:
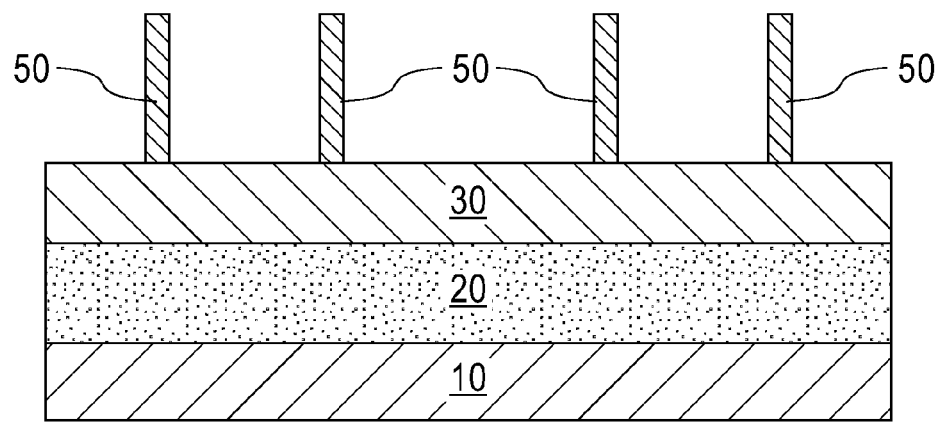
FIG. 3 is a cross-sectional view of the first exemplary semiconductor structure of FIG. 2 after removing the mandrels from the structure.
Figure 11:
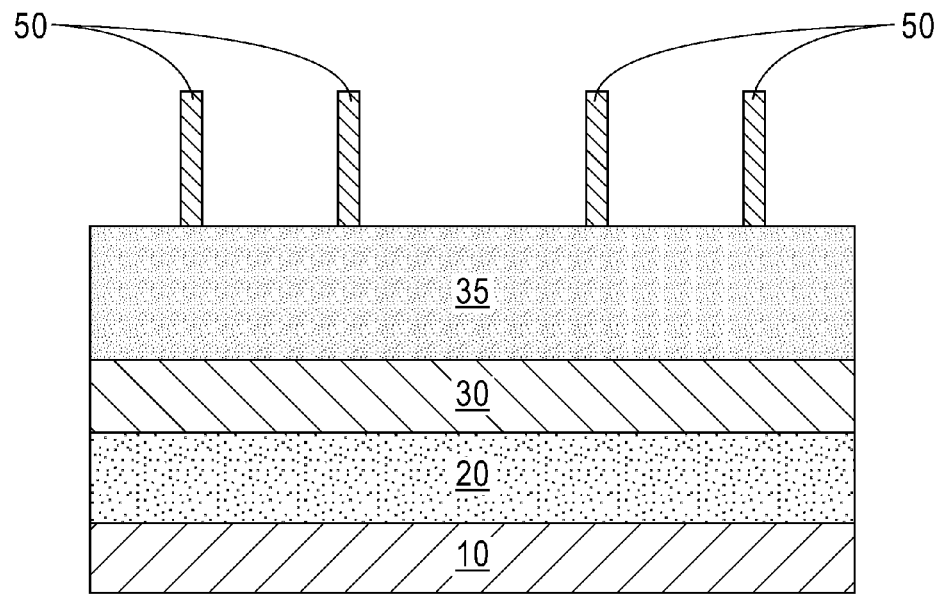
FIG. 11 is a cross-sectional view of the second exemplary semiconductor structure of FIG. 10 after removing the mandrels from the structure.

Referring to FIG. 11, the mandrels 40 are removed from the structure, leaving the spacers 50 present on top of the template layer 35 by performing the processing steps of FIG. 3.

Figure 12:
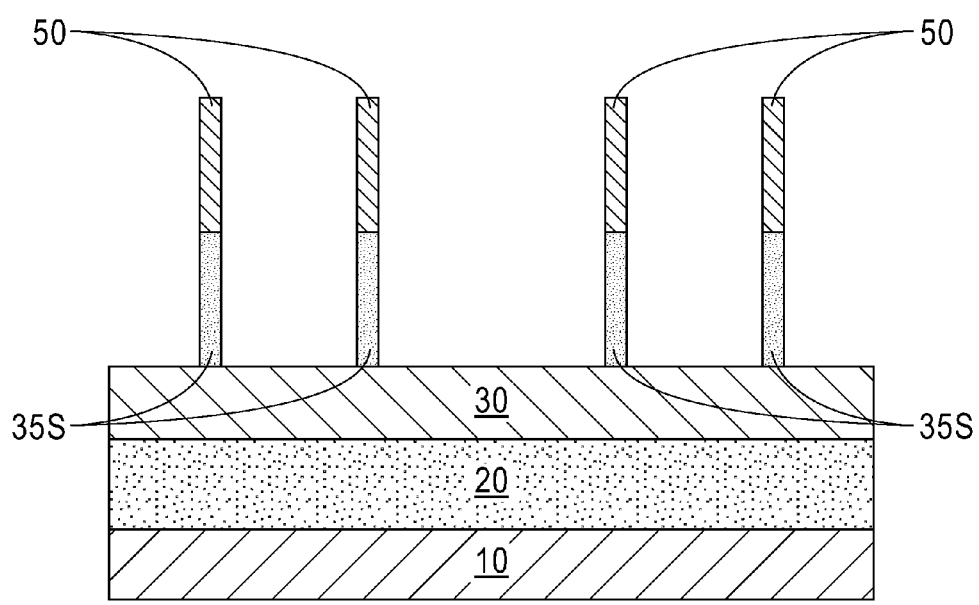
FIG. 12 is a cross-sectional view of the second exemplary semiconductor structure of FIG. 11 after forming template structures by patterning the template layer using the spacers as an etch mask.

Referring to FIG. 12, the template layer 35 is patterned using the spacers 50 as an etch mask. An isotropic etch such as a dry etch or a wet etch can be employed to remove the exposed portions of the template layer 35 that are not covered by the spacers 50. The remaining portions of the template layer 35 constitute template structures 35S for guiding the subsequently self-assembly of a block copolymer material. The width and profile of the template structures 35 depend on the etching conditions used. In one embodiment, the width of the template structures 35S is the same as the width of the spacers 50.

Figure 13:
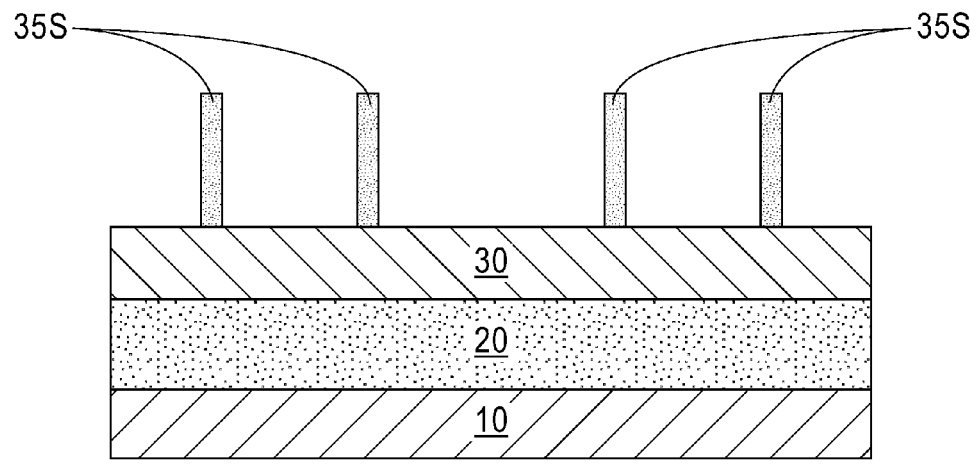
FIG. 13 is a cross-sectional view of the second exemplary semiconductor structure of FIG. 12 after removing the spacers from top surfaces of the template structures.

Referring to FIG. 13, the spacers 50 are removed from the top of the template structures 35S selective to the template structures 35S and the hard mask layer 30. The spacers 50 can be removed by an etch which can be an anisotropic etch or isotropic etch. Alternatively, the spacers 50 can also be removed by a chemical mechanical planarization (CMP) process.

Figure 14:
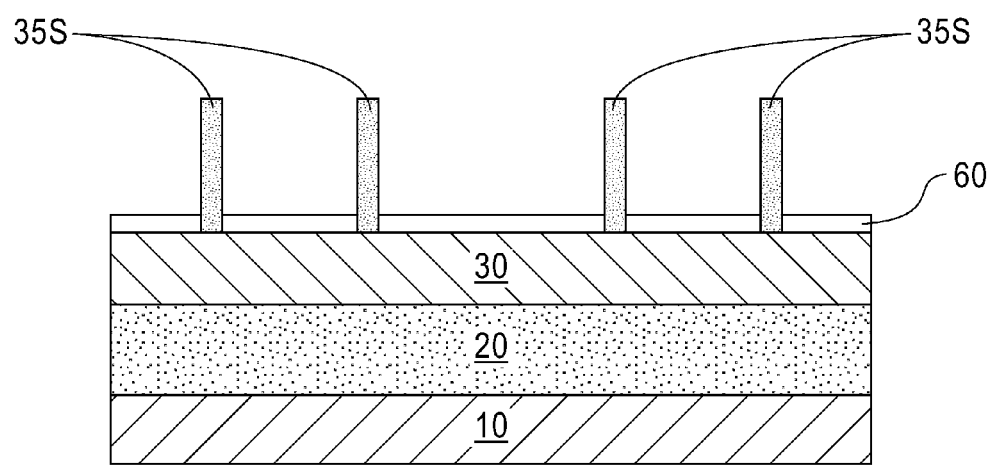
FIG. 14 is a cross-sectional view of the second exemplary semiconductor structure of FIG. 13 after forming a neutral material layer over the exposed portions of the hard mask layer.

Referring to FIG. 14, a neutral material layer 60 is formed on exposed portions of the hard mask layer 30 by performing the processing steps of FIG. 4.

Figure 15:
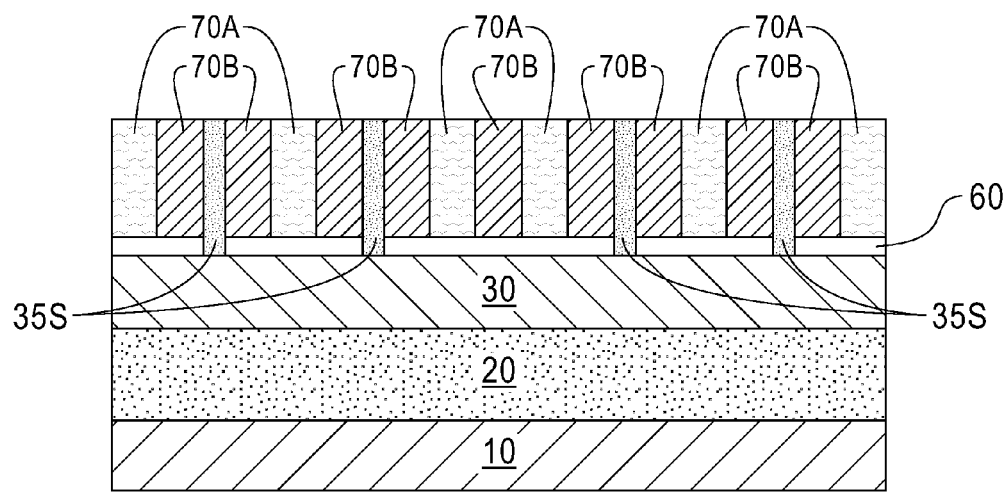
FIG. 15 is a cross-sectional view of the second exemplary semiconductor structure of FIG. 14 after directed self-assembly of a block copolymer material to form alternating first domains and second domains.

Referring to FIG. 15, a block copolymer material is applied over the hard mask layer 30 and the template structures 35S and annealed to cause the phase separation of the polymer block in the block copolymer material by performing the processing steps of FIG. 5. Microphase separation of the block polymer material provides a lamellar pattern of alternating first domains 70A and second domains 70B oriented perpendicular to the top surface of the neutral material layer 60 and parallel to the template structures 35S. In one embodiment, half-width domains 170B including the second polymer block as described above in FIG. 7 can also be formed adjacent to sidewalls of the template structures 35S (not shown) and remain in the structure after the subsequent removal of either domains 70A or 70B.

In the second embodiment of the present application, the spacers 50 generated from the sidewall image transfer process are used to pattern the underlying template layer 35 to provide the template structures 35S, which in turn are employed to guide the self-assembly of a block copolymer material during the DSA process. This can provide better uniformity in guiding surfaces, thereby widening the DSA processing window and improving line contrast.

Figure 16:
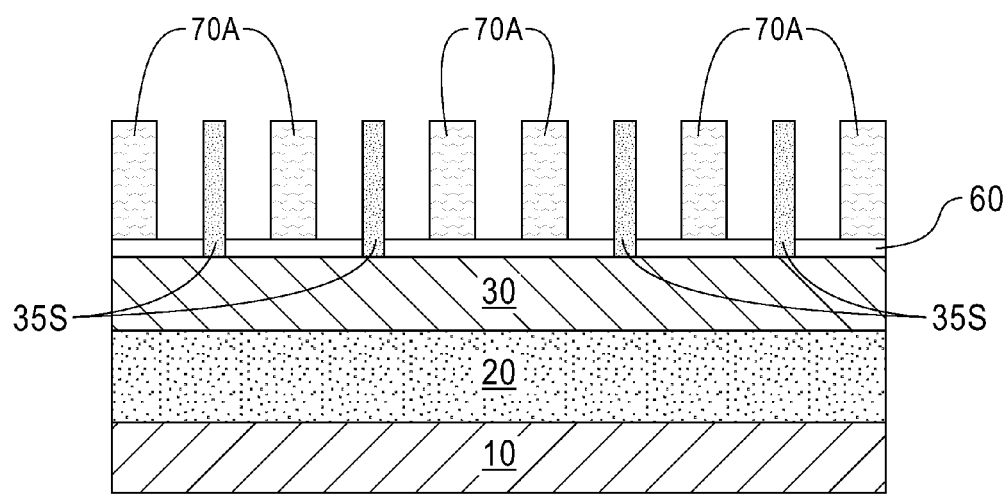
FIG. 16 is a cross-sectional view of the second exemplary semiconductor structure of FIG. 15 after removing the second domains.

Referring to FIG. 16, a DSA pattern including the first domains 70A protruding from the top surface of the neutral material layer 60 is formed by performing the processing steps of FIG. 6 to remove the second domains 70B from the structure.

Subsequently, the DSA pattern can be transferred through the OPL 20 into the substrate 10 by methods known in the art, thereby forming structures with a sub-lithographic dimension (not shown). The structures can be fin structures or interconnect structures.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of directed self-assembly of a block copolymer material comprising:
    forming spacers on sidewalls of a plurality of mandrels located on a hard mask layer;
    removing the plurality of mandrels, leaving the spacers protruding from a top surface of the hard mask layer;
    forming a neutral material layer on exposed portions of the hard mask layer that are not covered by the spacers, wherein the neutral material layer only surrounds a bottom portion of each of the spacers and directly contacts opposite sidewalls of each of the spacers;
    depositing the block copolymer material onto the neutral material layer and between the spacers;
    annealing the block copolymer material to form alternating first domains including a first polymer block of the block copolymer material and second domains including a second polymer block of the block copolymer material; and
    selectively removing the first domains or the second domains, wherein the neutral material layer remains contacting the opposite sidewalls of each of the spacers after the selectively removing the first domains or the second domains.

2. The method of claim 1, wherein the neutral material layer comprises a material that is chemically neutral to polymer blocks in the block copolymer material.

3. The method of claim 2, wherein the neutral material layer is made from a polymer brush material end substituted with a reactive functional group that is capable of bound to the top surface of the hard mask layer.

4. The method of claim 3, wherein the polymer brush material is a random copolymer of the polymer blocks of the block copolymer material end substituted with the reactive functional group.

5. The method of claim 4, wherein the block copolymer material comprises polystyrene (PS) and poly(methyl methacrylate) (PMMA) (PS-b-PMMA), and the random copolymer comprises PS and PMMA having an OH end group (PS-r-PMMA-OH).

6. The method of claim 3, wherein the forming the neutral material layer comprises:
    depositing the polymer brush material over exposed surfaces of the hard mask layer and the spacers;
    baking the polymer brush material to cause the polymer brush material to bound to the top surface of the hard mask layer; and
    removing an unreacted portion of the polymer brush material.

7. The method of claim 2, wherein the neutral material layer comprises a nitrogen-doped silicon carbide, a nitrogen-doped hydrogenated silicon carbide, or combinations thereof.

8. The method of claim 1, wherein each of the spacers comprises silicon nitride, and the hard mask layer comprises silicon dioxide or a dielectric metal oxide.

9. The method of claim 1, wherein the forming the spacers comprises:
    forming a spacer material layer on exposed surfaces of the plurality of mandrels and the hard mask layer; and
    removing horizontal portions of the spacer material layer, leaving vertical portions of the spacer material layer on the sidewalls of the plurality of mandrels.

10. The method of claim 1, wherein a first subset of the second domains is in direct contact with sidewalls of the spacers.

11. The method of claim 10, wherein the selectively removing the second domains removes a second subset of the second domains that does not contact the spacers, wherein the first subset of the second domains remains on the sidewalls of the spacers.

12. The method of claim 11, wherein the first subset of the second domains has a width equal to one half of a width of the second subset of the second domains.

13. The method of claim 1, wherein the hard mask layer comprises a dielectric oxide or a dielectric metal oxide.

14. The method of claim 1, wherein the hard mask layer comprises a material that is the same as a material of the neutral material layer.

15. The method of claim 1, further comprising forming the plurality of mandrels, wherein the forming the plurality of mandrels comprises:
    forming a mandrel material layer on a top surface of the hard mask layer; and
    patterning the mandrel material layer to provide the plurality of mandrels.

16. The method of claim 1, wherein the hard mask layer is formed on a stack of, from bottom to top, a substrate and an organic planarization layer (OPL).

17. The method of claim 1, wherein the removing the plurality of mandrels is performed by an oxygen-based plasma etching.

* * * * *